United States Patent [19]
Baba et al.

[11] Patent Number: 6,137,336
[45] Date of Patent: Oct. 24, 2000

[54] CIRCUIT AND METHOD FOR GENERATING MULTIPHASE CLOCK

[75] Inventors: Mitsuo Baba; Hiroki Teramoto, both of Tokyo, Japan

[73] Assignee: NEC Corporation, Tokyo, Japan

[21] Appl. No.: 09/317,856

[22] Filed: May 25, 1999

[30] Foreign Application Priority Data

May 29, 1998 [JP] Japan .................................. 10-150235

[51] Int. Cl.$^7$ ....................................................... G06F 1/04
[52] U.S. Cl. ........................... 327/295; 327/141; 327/156; 327/158
[58] Field of Search ..................................... 327/141, 144, 327/145, 149, 150, 156, 158, 159, 291, 293, 295, 299, 231, 237, 238, 239, 258, 259

[56] References Cited

U.S. PATENT DOCUMENTS 5,146,585  9/1992  Smith, III ................................ 395/550
5,568,078  10/1996  Lee ........................................... 327/262
5,844,436  12/1998  Altmann .................................. 327/156
5,867,332  2/1999  Mattison .................................. 360/51

Primary Examiner—Tuan T. Lam
Assistant Examiner—Linh Nguyen
Attorney, Agent, or Firm—McGinn & Gibb, P.C.

[57] ABSTRACT

A multiphase clock generating circuit having: a clock generating section for generating N-phase clock signals of number N which have a frequency nearly equal to that of input clock signal and whose phases are sequentially shifted by 360 degrees/N; an input side M-division circuit that divides the frequency of the input clock signal by M, outputting a reset signal to the clock generating section; an output side M-division circuit that is fed with a delayed reset signal that the reset signal output from the clock generating section is accompanied with a predetermined delay, and, synchronized with the delayed reset signal, divides the frequency of output clock signal output from the clock generating section by M; and a controller for comparing the input side M-division clock and the output side M-division clock, and controlling a delay amount of the clock generating section based on the comparison result.

16 Claims, 12 Drawing Sheets

CIRCUIT AND METHOD FOR GENERATING MULTIPHASE CLOCK

FIELD OF THE INVENTION

This invention relates to a circuit and a method for generating a multiphase clock used to extract data signal in PLL.

BACKGROUND OF THE INVENTION

Conventionally, a multiphase clock is used to extract data signal in PLL (phase-locked loop). As PLL has an important place in the field of information communications, various types of multiphase clock generating circuits, which are used mainly to extract data, have been developed.

Examples of conventional multiphase clock generating circuit are explained in reference to FIGS. 1 and 2.

FIG. 1 is a block diagram showing the composition of a conventional multiphase clock generating circuit. As shown in FIG. 1, the conventional multiphase clock generating circuit is composed of a clock generating section 1000 that is fed with input clock signal and then outputs N output clock signals $\phi$100 to $\phi$N00 which have a frequency nearly equal to that of input clock signal and whose phases are shifted sequentially by 360/N, where N is an arbitrary positive integer of 2 or more, an input side M-dividing circuit 2000 that divides this input clock signal into M frequencies to output an input side M-divided signal 7000, where M is a positive integer, an output side M-dividing circuit 3000 that is fed with output clock signal 8000 output from the clock generating section 1000 and then divides the frequency of output clock signal 8000 by M to output an output side M-divided signal 10000, a phase comparison circuit 4000 that compares the phases of input side M-divided clock signal 7000 and output side M-divided clock signal 10000 and then outputs a phase comparison information 11000, and a control circuit 5000 that outputs N control signals 1200-1 to 1200-N based on the phase comparison information 11000 output from the phase comparison circuit 4000.

Next, the operations of respective components of the conventional multiphase clock generating circuit in FIG. 1 are explained in detail.

First, the input side M-dividing circuit 2000 divides the frequency of input clock signal by M to make the input side M-divided clock signal 7000, then outputting it to the phase comparison circuit 4000. Also, the input side M-dividing circuit 2000 outputs a control clock signal 13000 to the control circuit 5000.

Then, the output side M-dividing circuit 3000 divides the frequency of output clock signal 8000 by N to make the output side M-divided clock signal 10000, then outputting it to the phase comparison circuit 4000.

Then, the phase comparison circuit 4000 compares the phase difference between the input side M-divided clock signal 7000 and the output side M-divided clock signal 10000, then outputting the phase comparison information 11000 to indicate the phase difference to the control circuit 5000.

The control circuit 5000 outputs the control signals 1200-1 to 1200-N to the clock generating section 1000, based on the phase comparison information 11000. The clock generating section 1000 outputs generating N output clock signals $\phi$100, ..., $\phi$N00, which have a frequency nearly equal to that of input clock signal and whose phases are shifted sequentially by 360/N degree, from input clock signal based on the control signals 1200-1 to 1200-N.

The operation of the clock generating section 1000 in FIG. 1 is further explained in detail, referring to FIG. 2. FIG. 2 is a block diagram showing a composition of the clock generating section 1000 in FIG. 1.

As shown in FIG. 2, the clock generating section 1000 in FIG. 1 is composed of N adjustable delay circuits 20100-1, 20100-2, 20100-3, ..., 20100-N, where N is an arbitrary integer of 1 or more, that are fed with input clock signal like a pipeline and then output delaying the input clock signal by the control of N control signals 1200-1 to 1200-N.

First, as shown in FIG. 2, the clock generating section 1000 provided for the conventional multiphase clock generating circuit outputs the unaltered input clock signal as output clock signal $\phi$100.

Then, delaying the input clock signal by the adjustable delay circuit 20100-1 based on the control signal 1200-1 supplied, output clock signal $\phi$200 is output from the adjustable delay circuit 20100-1.

Then, delaying the output clock signal $\phi$200 output from the adjustable delay circuit 20100-1 by the adjustable delay circuit 20100-2 based on the control signal 1200-2 supplied, output clock signal $\phi$300 is output from the adjustable delay circuit 20100-2.

Below, in like manner, output clock signals $\phi$400, ..., $\phi$N00 are output in sequence. Thus, from the conventional multiphase clock generating circuit, N output clock signals which have a frequency nearly equal to that of input clock signal and whose phases are shifted sequentially by 360/N can be output.

In recent years, PLLs, which extract data signal, using multiphase clock have been researched a great deal. Many of these PLLs use an analogue circuit, such as VCO, when generating multiphase clock. Therefore, in such a case that the multiphase clock generating circuit is integrated in a digital logic LSI, the affect to the analogue circuit, such as a noise occurred in digital logic and a noise from power supply, is necessary to solve. However, it is very difficult to solve it.

For example, when the affect to the analogue circuit, such as a noise occurred in digital logic and a noise from power supply, is not solved sufficiently, in FIG. 1, the amount T of delay in the clock generating section 1000 may be not equal to one-cycle delay amount T but equal to two-cycle or three-cycle delay amount 2T or 3T. Therefore, there occurs a problem that the multiphase clock signal output does not correspond to the N-phase clock signal.

Further, in the conventional multiphase clock generating circuit, when the input clock signal whose one cycle is to be equally divided is a high-speed input clock signal (with a high frequency), the minimum value of delay amount of the clock generating section 1000 may exceed a cycle T. Therefore, it causes a failure in making multiphase clock.

SUMMARY OF THE INVENTION

Accordingly, it is an object of the invention to provide a circuit and a method for generating multiphase clock that can generate a multiphase clock where one cycle of input clock signal is divided equally even against the affect of noise and can easily generate a multiphase clock even for high-speed clock signal.

According to the invention, a multiphase clock generating circuit with a clock generating section for generating N-phase clock signals of number N which have a frequency nearly equal to that of input clock signal and whose phases are sequentially shifted by 360 degrees/N, where N is an arbitrary integer of 2 or more, comprises:

an input side M-division circuit that divides the frequency of the input clock signal by M, where M is an positive integer, outputting it as an input side M-division clock and simultaneously outputting a reset signal to the clock generating section;

an output side M-division circuit that is fed with a delayed reset signal that the reset signal output from the clock generating section is accompanied with a predetermined delay, and, synchronized with the delayed reset signal, divides the frequency of output clock signal output from the clock generating section by M, outputting it as an output side M-division clock; and means for comparing the input side M-division clock output from the input side M-division circuit and the output side M-division clock output from the output side M-division circuit, and controlling a delay amount of the clock generating section based on the comparison result.

According to another aspect of the invention, a multiphase clock generating circuit, comprises:

an input side N-division circuit (2) that is fed with an input clock signal and outputs an input side M-division clock (7) that the frequency of the input clock signal is divided by M, where M is an positive integer, and synchronized with the input side M-division clock (7), a reset signal (6) with a cycle nearly equal to that of the input clock signal and a control clock signal (13);

a clock generating section (1, 101, 102) that is fed with the input clock signal and outputs N-phase clock signals ($\phi 1, \phi 2, \ldots, \phi N$) of number N, where N is an arbitrary integer of 2 or more, which have a frequency nearly equal to that of the input clock signal and whose phases are sequentially shifted by 360 degrees/N based on control signals (12-1, 12-2, ..., 12-N) output from a control circuit (5), an output clock signal (8) that the input clock signal is delayed and a delayed reset signal (9) with a phase nearly equal to that of the output clock signal (8);

an output side M-division circuit (3) that divides the output clock signal (8) output from the clock generating section (1, 101, 102) by a same frequency-division ratio as the input side M-division clock (7) based on the delayed reset signal (9), and outputs an output side M-division clock (10);

a phase comparison circuit (4) that is fed with the input side M-division clock (7) output from the input side M-division circuit (2) and the output side M-division clock (10) output from the output side M-division circuit (3), comparing the phases of the input side M-division clock (7) and output side M-division clock (10), outputting the comparison result as phase comparison information (11); and the control circuit (5) that is fed with the control clock signal (13) and the phase comparison information (11) and outputs the control signals (12-1, 12-2, ..., 12-N) used to control the delay amount of the clock generating section (1, 101, 102) to the clock generating section.

According to another aspect of the invention, a multiphase clock generating method for generating N-phase clock signals of number N which have a frequency nearly equal to that of input clock signal and whose phases are sequentially shifted by 360 degrees/N at a clock generating step, where N is an arbitrary integer of 2 or more, comprises:

an input side M-division step that divides the frequency of the input clock signal by M, where M is an positive integer, outputting it as an input side M-division clock and simultaneously outputting a reset signal to the clock generating step;

an output side M-division step that is fed with a delayed reset signal that the reset signal output from the clock generating step is accompanied with a predetermined delay, and, synchronized with the delayed reset signal, divides the frequency of output clock signal output from the clock generating step by M, outputting it as an output side M-division clock; and a step for comparing the input side M-division clock output from the input side M-division step and the output side M-division clock output from the output side M-division step, and controlling a delay amount at the clock generating step based on the comparison result.

According to another aspect of the invention, a multiphase clock generating method, comprises:

an input side M-division step that is fed with an input clock signal and outputs an input side M-division clock that the frequency of the input clock signal is divided by M, where M is an positive integer, and synchronized with the input side M-division clock, a reset signal with a cycle nearly equal to that of the input clock signal and a control clock signal;

a clock generating step that is fed with the input clock signal and outputs N-phase clock signals of number N, where N is an arbitrary integer of 2 or more, which have a frequency nearly equal to that of the input clock signal and whose phases are sequentially shifted by 360 degrees/N based on control signals output from a control step, an output clock signal that the input clock signal is delayed and a delayed reset signal with a phase nearly equal to that of the output clock signal;

an output side M-division step that divides the output clock signal output from the clock generating step by a same frequency-division ratio as the input side M-division clock based on the delayed reset signal, and outputs an output side M-division clock;

a phase comparison step that is fed with the input side M division clock output from the input side M-division step and the output side M-division clock output from the output side M-division step, comparing the phases of the input side M-division clock and output side M-division clock, outputting the comparison result as phase comparison information; and the control step that is fed with the control clock signal and the phase comparison information and outputs the control signals used to control the delay amount of the clock generating step to the clock generating step.

BRIEF DESCRIPTION OF THE DRAWINGS

The invention will be explained in more detail in conjunction with the appended drawings, wherein.

DESCRIPTION OF THE PREFERRED EMBODIMENTS

A circuit and a method for generating multiphase clock in the preferred embodiments according to the invention will be explained below in reference to the drawings.

Figure 1:
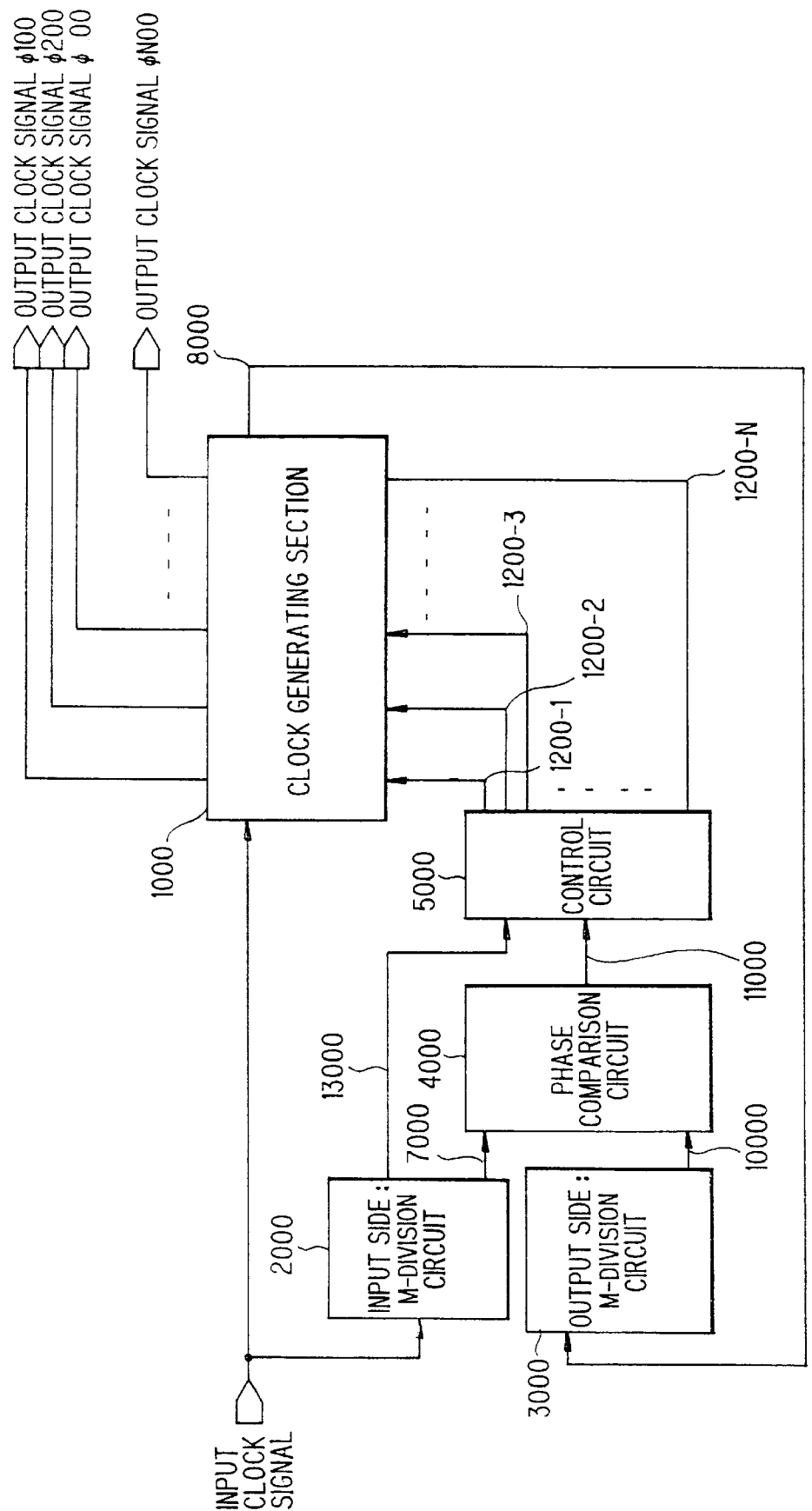
FIG. 1 is a block diagram showing the composition of a conventional multiphase clock generating circuit.
Figure 2:
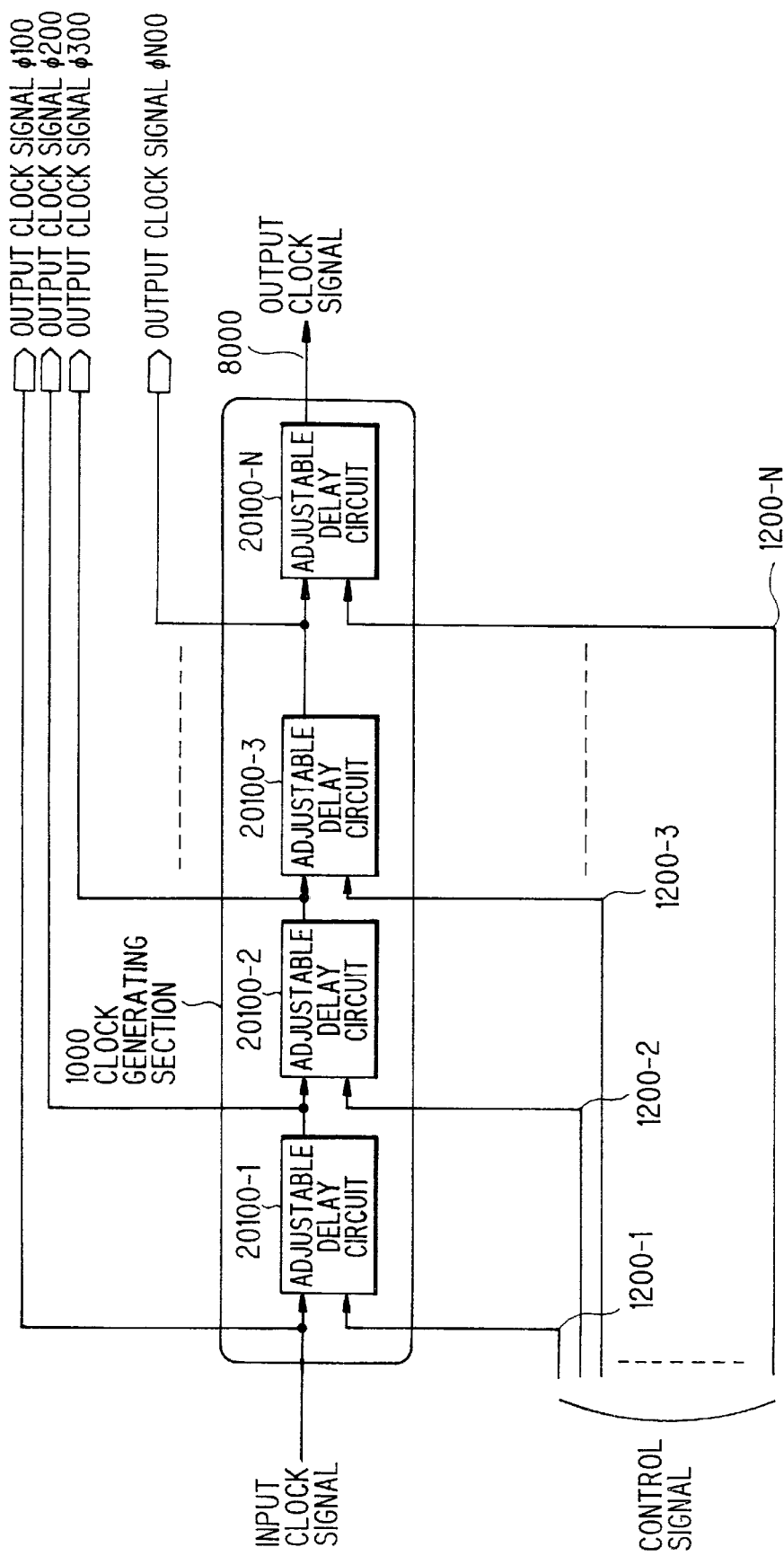
FIG. 2 is a block diagram showing the composition of a clock generating section in FIG. 1.
Figure 3:
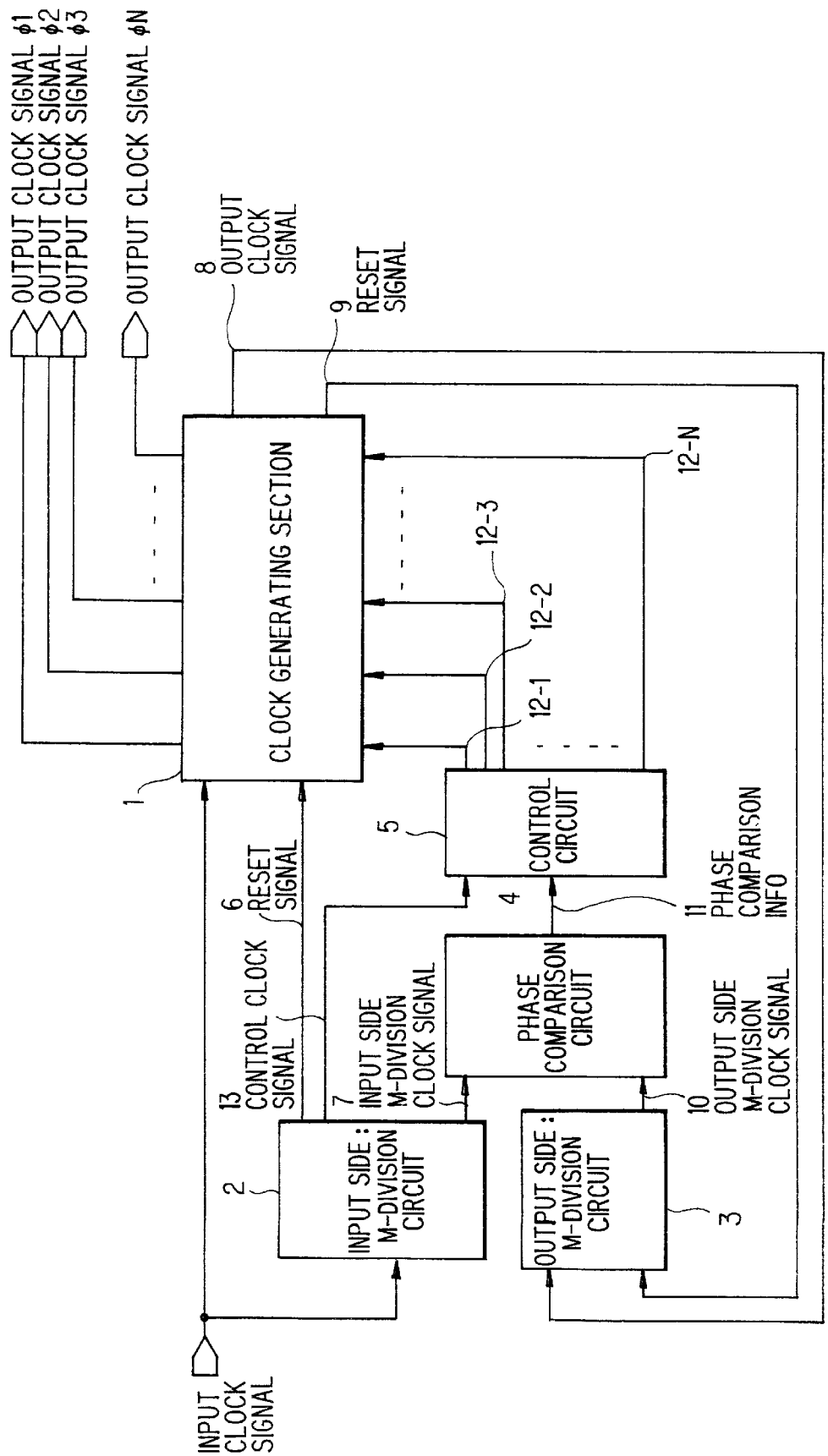
FIG. 3 is a block diagram showing a multiphase clock generating circuit in a first preferred embodiment according to the invention.

FIG. 3 is a block diagram showing the composition of a circuit for generating multiphase clock in the first preferred embodiment according to the invention. Meanwhile, explanations, described below, for the circuit for generating multiphase clock in the first preferred embodiment according to the invention are also applicable to a method for generating multiphase clock in the first preferred embodiment according to the invention.

As shown in FIG. 3, the circuit for generating multiphase clock in the first preferred embodiment according to the invention is composed of input side M-dividing circuit 2 that is fed with input clock signal and then outputs an input side M-divided clock signal 7 obtained by dividing the input clock signal by M, where M is an arbitrary positive integer, a reset signal 6 for synchronizing with an output side M-dividing circuit 3, and a control clock signal 13 for controlling a control circuit 5.

Also, it is composed of a clock generating section 1, which is provided with N adjustable delay circuits 201-1 to 201-N connected in series, that is fed with the input clock signal, reset signal 6 output from the input side M-dividing circuit 2 and control signals 12-1 to 12-N and then generates an output clock signal 8 obtained by delaying the input clock signal according to the control signals 12-1 to 12-N and a reset signal 9 with a same phase as the output clock signal 8.

Also, it is composed of the output side M-dividing circuit 3 (with a same frequency-division ratio as the input side) that is fed with the output clock signal 8 and reset signal 9 and then generates an output side M-divided clock signal 10 which is divided at the time earlier by one clock of input clock signal than the input side M-divided clock signal 7 while synchronizing with the reset signal 9.

Further, it is composed of a phase comparison circuit 4 that is fed with the input side M-divided clock signal 7 and output side M-divided clock signal 10 and then conducts the phase comparison between the variation points of these signals and then outputs the phase comparison result as phase comparison information 11.

Also, it is composed of the control circuit 5 that is fed with the phase comparison information 11 and then generates the clock signals 12-1 to 12-N which are N control signals to the clock generating section 1.

As described above, from the control circuit 5, the N control signals 12-1 to 12-N are output to the clock generating section 1. In this invention, the feedback control operation is repeated so that the delay amount of the clock generating section 1 becomes equal to one-cycle delay amount (hereinafter referred to as 'T') of input clock signal, by the N control signals 12-1 to 12-N.

Also, in the delay control by the multiphase clock generating circuit in the first embodiment of the invention, all the N control signals 12-1 to 12-N are not changed simultaneously. Only one control signal is changed in one-time control.

Therefore, the delay amount of only one adjustable delay circuit 201-i, where i is an integer of 1 or more and N or less, that composes the clock generating section 1 is changed as described later. Also in view of the entire clock generating section 1, only this delay amount is changed.

On the other hand, to generate N-phase clock signal in the clock generating section 1 is conducted by composing the clock generating section 1 by N adjustable delay circuits with a same composition, taking out output signal from the respective adjustable delay circuit, generating output clock signals ($\phi1$, $\phi2$, . . . , $\phi N$) as N N-phase clock signals which have a frequency equal to input clock signal and whose phases are shifted sequentially by 360 degrees/N, where N is an arbitrary integer of 2 or more.

In order to obtain such N-phase clock signals, it is necessary to delay-control so that the delay amount of the clock generating section 1 becomes equal to T. However, in prior arts, since input clock signal and output clock signal are frequency-divided separately and then are phase-compared thereby controlling the delay amount of the clock generating section, depending on the operation of frequency-division circuit or the delay amount of the clock generating section, the clock generating section may draw delay amount of not T but two-cycle 2T or three-cycle 3T, which causes a failure in making N-phase clock.

To solve this problem, in the multiphase clock generating circuit of the invention, the input side M-dividing circuit generates reset signal 6, the clock generating section 1 generates reset signal 9 that a delay amount equal to that of the output clock signal 8 is added to the reset signal 6, the output side M-dividing circuit 3 is synchronized with the input side M-dividing circuit 2 using this reset signal 9. Thereby, the phase difference between the input side M-dividing circuit 2 and the output side M-dividing circuit 3 is always kept to be the delay amount of the clock generating section 1. The phase comparison can be conducted normally and the delay amount of the clock generating section 1 can be kept T.

Figure 4:
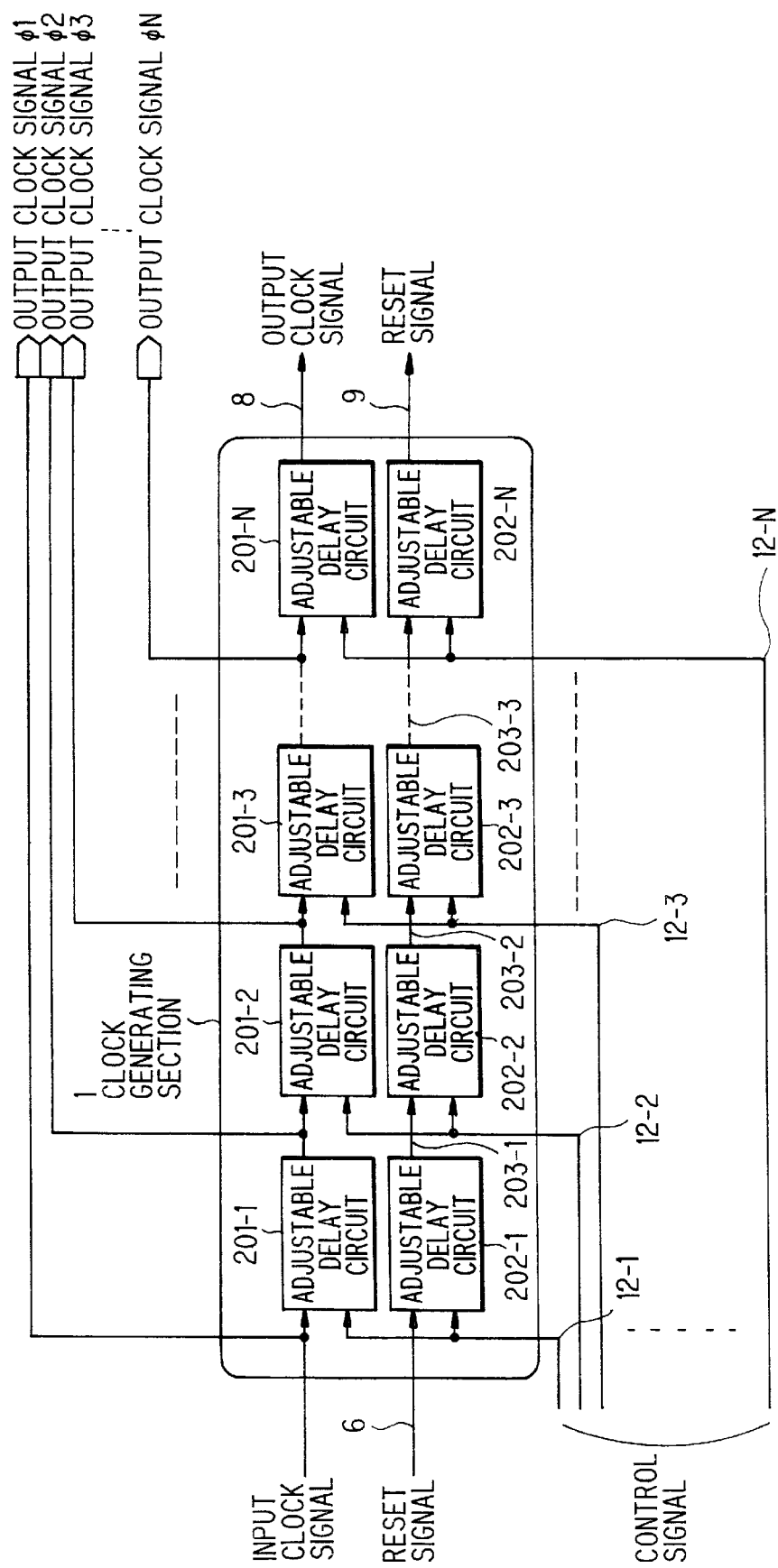
FIG. 4 is a block diagram showing a compositional example of a clock generating section provided for the multiphase clock generating circuit in FIG. 3.

Next, referring to FIG. 4, the clock generating section 1 is explained. FIG. 4 is a block diagram showing the composition of the clock generating section 1 provided for the multiphase clock generating circuit in FIG. 3.

As shown in FIG. 4, the clock generating section 1 is composed of N adjustable delay circuits 201-1 to 201-N, which are connected in series, that are fed with input clock signal like a pipeline and then sequentially generate N output clock signals $\phi1$, . . . , $\phi N$, and N adjustable delay circuits 202-1 to 202-N, which have a circuit composition similar to the N adjustable delay circuits 201-1 to 200-N, that are fed with reset signal 6 like a pipeline and then generates reset signal 9. Here, 203-1 and the like in FIG. 4 show reset signals delayed sequentially.

The N adjustable delay circuits 202-1 to 202-N have a circuit composition similar to the N adjustable delay circuits 201-1 to 201-N.

Next, referring to FIGS. 3 and 4, the multiphase clock generating circuit in the first embodiment according to the invention is explained further in detail.

First, the operations of the respective components in FIG. 3 are explained in detail. The input side M-dividing circuit 2 is fed with input clock signal, generating the input side M-divided clock signal 7, where M is a positive integer of 1 or more, reset signal 6 and control clock signal 13.

The clock generating section 1 is fed with input clock signal and reset signal 6, generating N clock signals φ1, . . . , φN which have a frequency nearly equal to that of input clock signal and whose phases are shifted sequentially by 360 degrees/N, where N is an arbitrary integer of 2 or more, the output clock signal 8 and the reset signal 9 with a same phase as the output clock signal 8.

The output side M-dividing circuit 3 is fed with output clock signal 8 and reset signal 9, generating the output side M-divided clock signal 10 (with a same frequency-division ratio as the input side).

The phase comparison circuit 4 is fed with input side M-divided clock signal 7 and output side M-divided clock signal 10, generating N control signals 12-1 to 12-N, only one of which is changed.

Thus, the multiphase clock generating circuit in the first embodiment according to the invention is composed of the feedback circuit of the above components, and by repeating this serial operations, the delay amount of the clock generating section 1 is controlled to be equal to one-cycle delay amount, T, of input clock signal.

Referring to FIG. 4, the clock generating section 1 in FIG. 3 is explained. As shown in FIG. 4, the N adjustable delay circuits 201-1 to 201-N are fed with input clock signal input like a pipeline, generating sequentially N output clock signals φ1, . . . , φN.

Also, the N adjustable delay circuits 202-1 to 202-N, which have a circuit composition similar to the N adjustable delay circuits 201-1 to 201-N, are fed with reset signal 6 input like a pipeline, generating reset signal 9 delayed.

Figure 5:
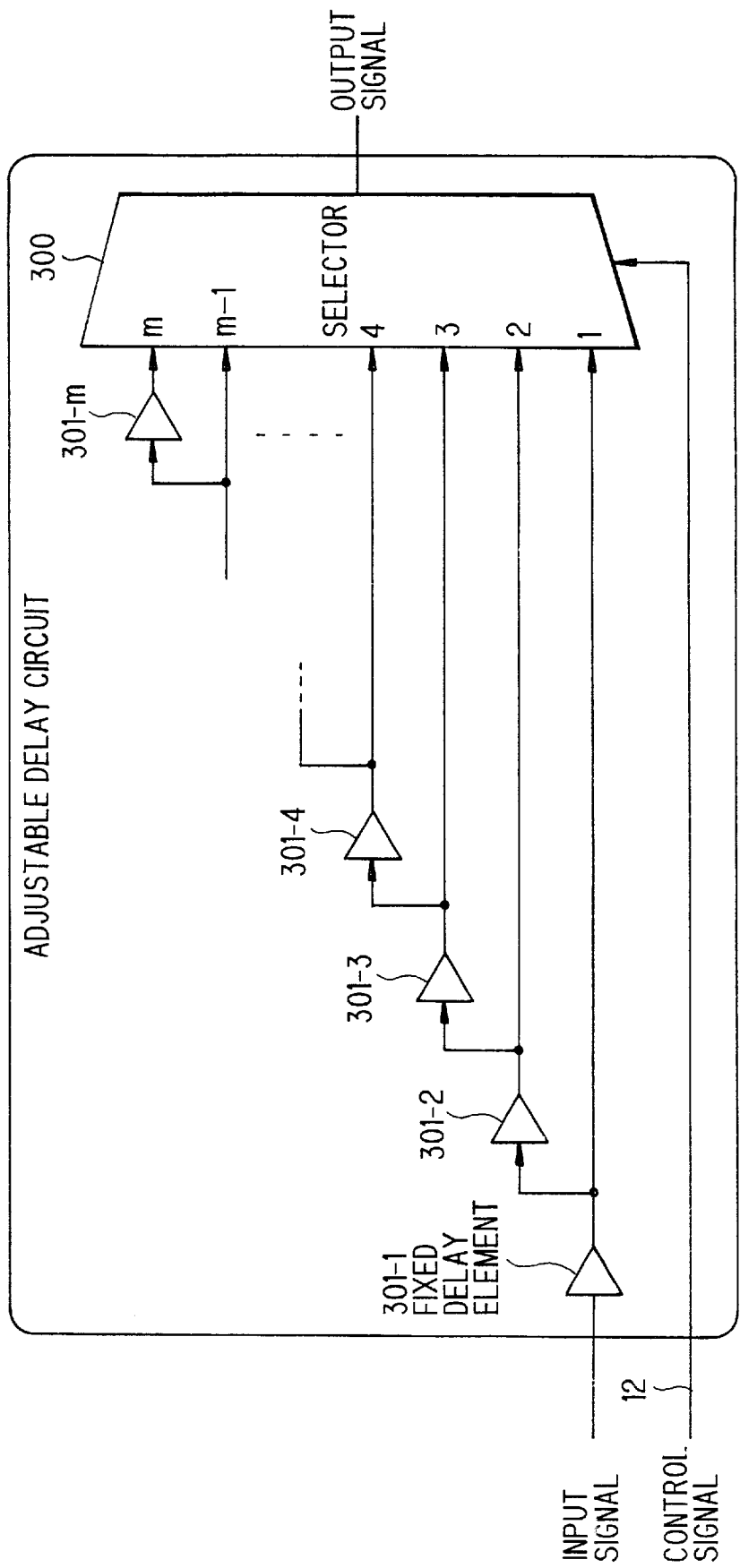
FIG. 5 is a block diagram showing a compositional example of a adjustable delay circuit provided for the clock generating section in FIG. 4.

Here, each of the adjustable delay circuits in FIG. 4 is explained in reference to FIG. 5. FIG. 5 is a block diagram showing a composition of the adjustable delay circuit in FIG. 4.

As shown in FIG. 5, the adjustable delay circuit in FIG. 4 is composed of a fixed delay element 301-j, where j is an arbitrary integer of 1 or more and m or less, that is fed with input signal and then outputs output signal with a fixed delay added, and a selector 300 that selects m fixed delay element 301-j by control signal 12-i, where i is an arbitrary integer of 1 or more and N or less, output from the control circuit 5.

As shown in FIG. 5, the output from fixed delay element 301-j is unalteredly input to the selector 300, and simultaneously input to the next-stage fixed delay element 301-j+1, as input signal to the next-stage fixed delay element 301-j+1. Therefore, output signal from the fixed delay element is given adding the delay amount sequentially.

Figure 6:
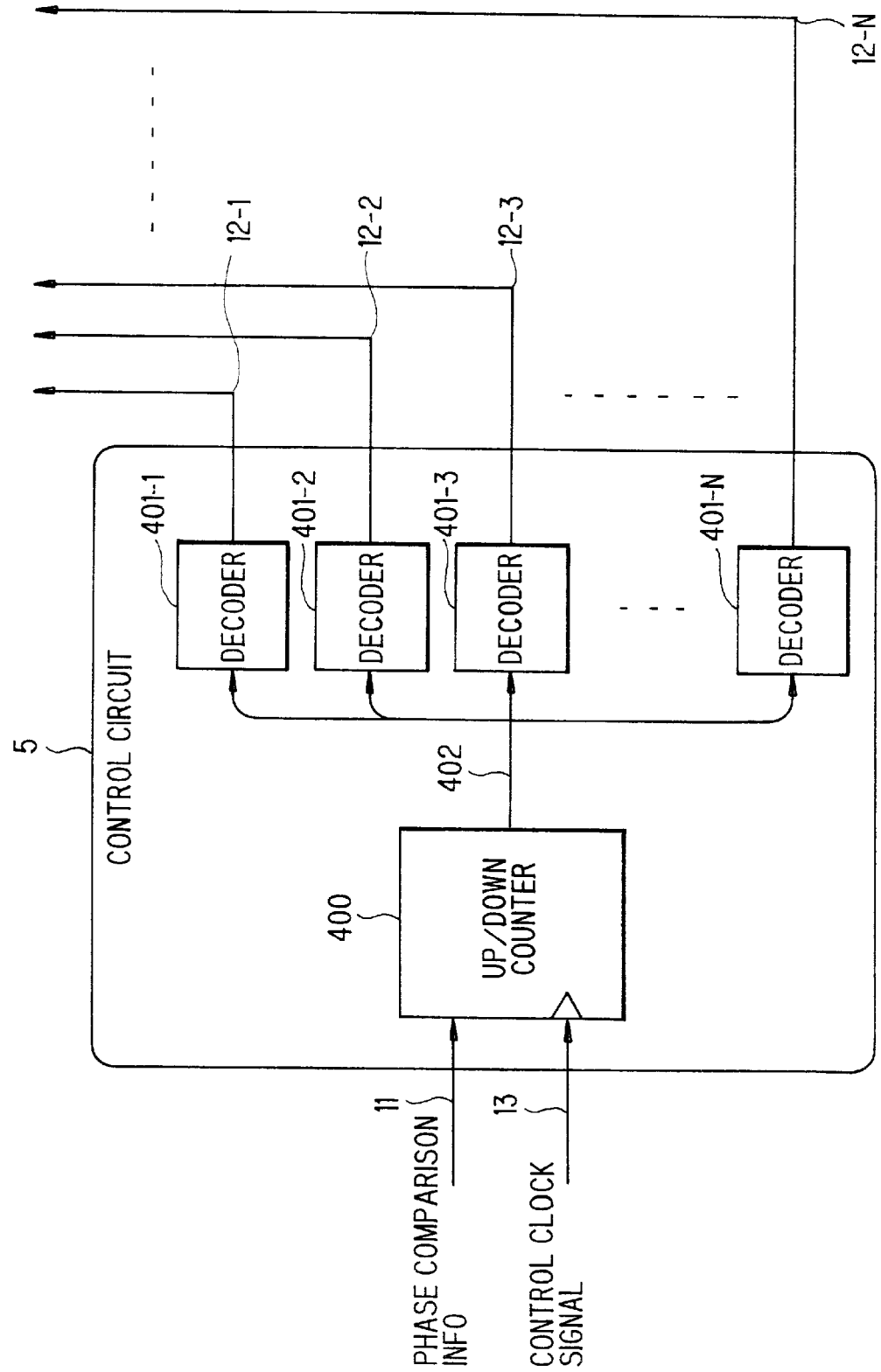
FIG. 6 is a block diagram showing a compositional example of a control circuit in FIG. 3.

Next, the control circuit 5 in FIG. 3 is explained referring to FIG. 6. FIG. 6 is a block diagram showing a composition of the control circuit 5 in FIG. 3.

The control circuit 5 is composed of an UP/DOWN counter 400 that is fed with phase comparison information 11 and control clock signal 13 and then generates a count value 402, and decoders 401-1 to 401-N that are fed with the counter value 402 and then generates the control signals 12-1 to 12-N.

The operation of the multiphase clock generating circuit in the first embodiment according to the invention in FIG. 3 is explained referring the drawings. In examples explained below, the phase number N of N-phase clock signal generated is 8 and the frequency-division ratio M of the input-side and output-side M-dividing circuits is 8. Of course, this invention is not limited to the use of these values of N and M and may use other proper values.

Figure 7:
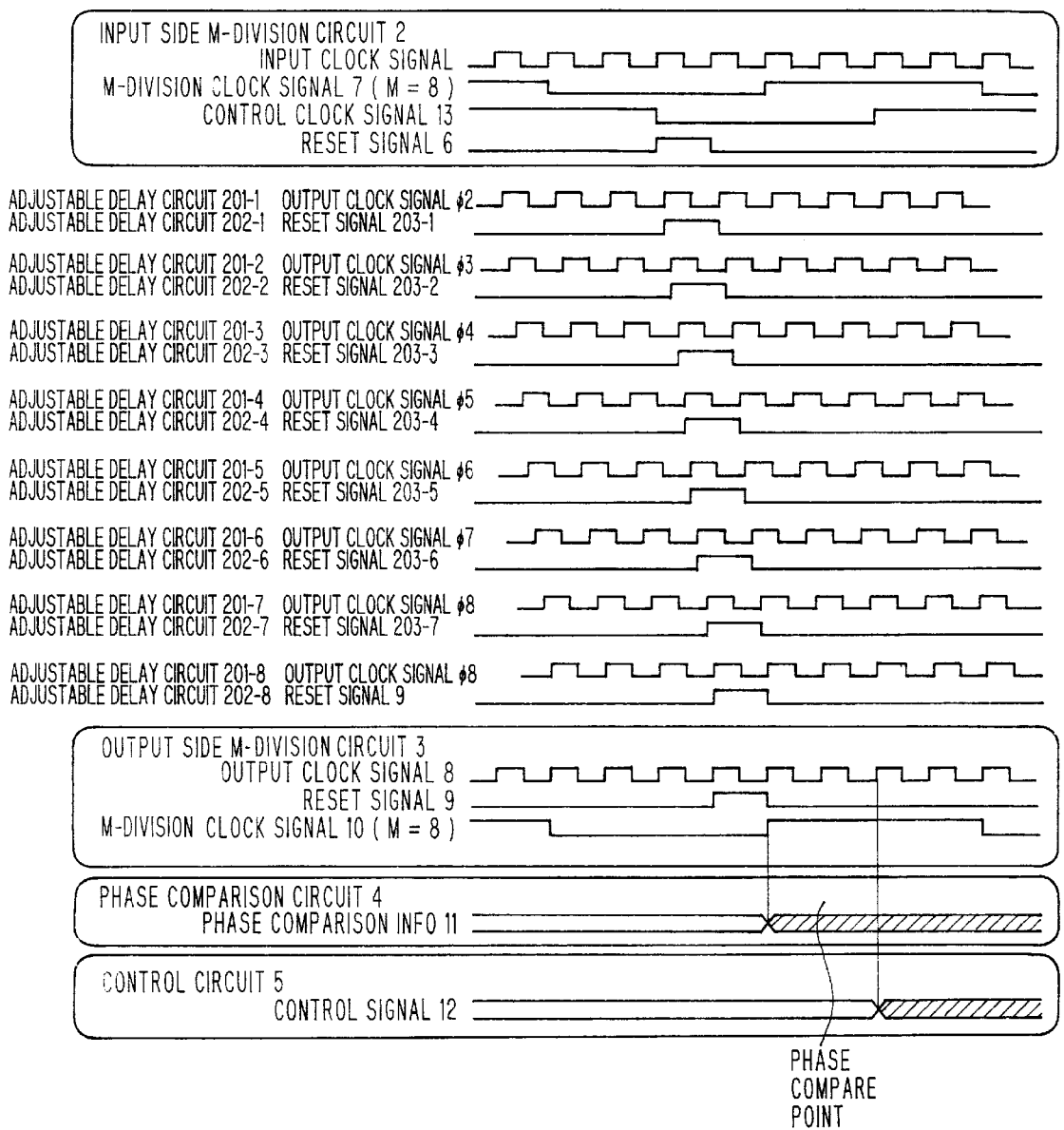
FIG. 7 is a time chart relating to the operation of the clock generating section in FIG. 3.

First, the operation of the clock generating section 1 in FIG. 3 is explained referring to FIG. 7. FIG. 7 is a time chart relating to the operation of the clock generating section 1 in FIG. 3.

Referring to FIG. 7, the input side M(8) -dividing circuit 2 is 20 fed with input clock signal, then outputting M(8)-divided clock signal 7, reset signal 6 and control signal 13.

Then, the adjustable delay circuit 201-1 is fed with input clock signal, outputting output clock signal φ2 that a delay amount of Tx(1/8) is added to the cycle T of input clock signal.

Simultaneously, the adjustable delay circuit 202-1 is fed with reset signal 6, outputting reset signal 203-1 that the same delay amount, i.e., Tx(1/8), as the adjustable delay circuit 201-1 is added.

In the clock generating section 1, the similar operation to the adjustable delay circuit 201-1 is repeated for the following adjustable delay circuits 201-2 to 201-8, whereby output clock signals φ2 to φ8 and output clock signal 8 are output. Also, the similar operation to the adjustable delay circuit 202-1 is repeated for the following adjustable delay circuits 202-2 to 202-8, whereby reset signals 203-1 to 203-7 and reset signal 9 are output.

The output-side M(8) -dividing circuit 3 is fed with the output clock signal 8 and reset signal 9, outputting the M(8) -divided clock signal 10.

The phase comparison circuit 4 is fed with the M(8)-divided clock signal 7 and M(8) -divided clock signal 10, outputting the phase comparison information 11.

The control circuit 5 is fed with the phase comparison information 11 and control clock signal 13, outputting clock signals 12-1 to 12-8 to control the adjustable delay circuits 201-1 to 201-8 and 202-1 to 202-8.

Figure 8:
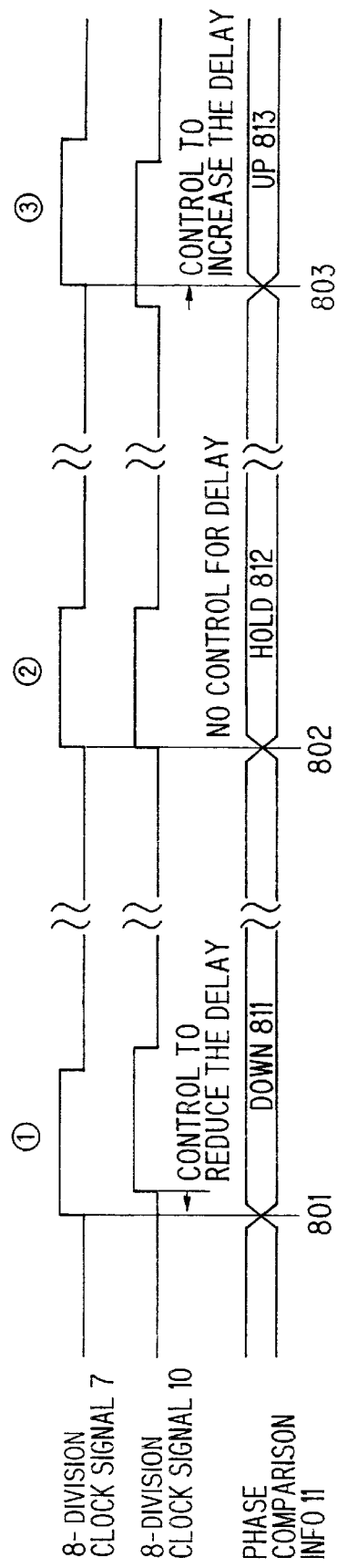
FIG. 8 is a time chart relating to the phase comparison operation of a phase comparison circuit in FIG. 3.

The operation of the phase comparison circuit 4 is explained referring to FIG. 8. FIG. 8 is a time chart showing the operation of the phase comparison circuit 4.

At ① in FIG. 8, the rising 801 of M(8)-divided clock signal 7 indicates the condition that the delay amount of M(8)-divided clock signal 10 to M(8)-divided clock signal 7 is in excess. In this condition, phase comparison information 11 with DOWN 811 that gives instructions to reduce the delay amount is output from the phase comparison circuit 4 to the control circuit 5.

At ② in FIG. 8, the rising 802 of M(8)-divided clock signal 7 indicates the condition that the delay amount of M(8)-divided clock signal 7 is approximate or equal to that of M(8)-divided clock signal 10. In this condition, phase comparison information 11 with HOLD 812 that gives instructions not to increase/reduce the delay amount is output from the phase comparison circuit 4 to the control circuit 5. As a result, at the control circuit 5, none of control signals 12-1 to 12-8 changes the state.

At ③ in FIG. 8, the rising 803 of M(8)-divided clock signal 7 indicates the condition that the delay amount of M(8)-divided clock signal 10 to M(8)-divided clock signal 7 is lacking. In this condition, phase comparison information 11 with DOWN 813 that gives instructions to increase the delay amount is output from the phase comparison circuit 4 to the control circuit 5.

Figure 9:
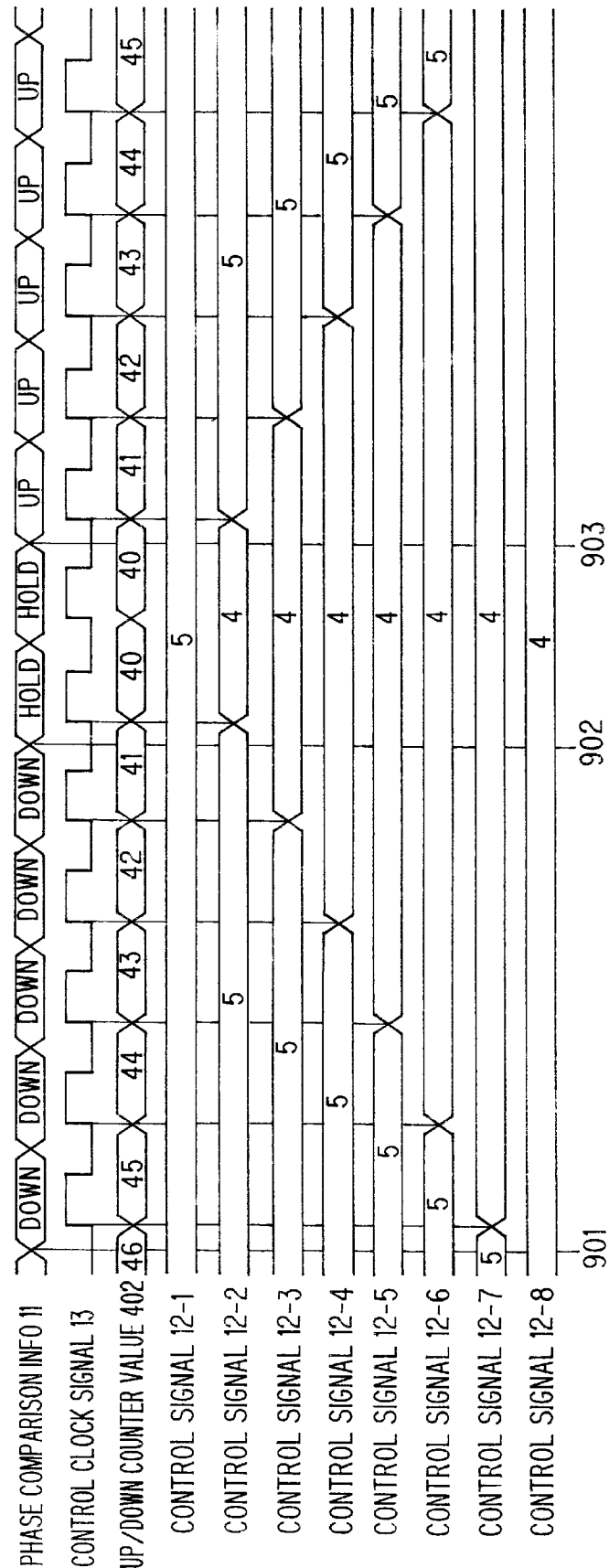
FIG. 9 is a time chart relating to the operation of the control circuit in FIG. 3.

Next, the operation of the control circuit 5 is explained referring to FIG. 9. FIG. 9 is a time chart showing the operation of the control circuit 5 in FIG. 3.

As shown in FIG. 9, from change points 901 to 902 of phase comparison information 11, the delay amount is in excess, and the count value 402 of the UP/DOWN counter 401 is subtracted and for the control signal 12, 12-7 to 12-2 decrease sequentially.

At the change point 902 of phase comparison information 11, the delay amount comes into stable conditions, and the count value 402 of the UP/DOWN counter 401 is kept in constant conditions (in FIG. 9, the counter value 402 is stabilized at 40).

After change point 903 of phase comparison information 11, the delay amount is lacking again due to the environmental change, and the count value 402 of the UP/DOWN counter 401 is added and for the control signal 12, 12-2 to 12-6 decrease sequentially.

Thus, when the delay amount changes due to the environmental change etc., the above operation is repeated and thereby the UP/DOWN counter 401 is controlled so that the count value 402 is kept in constant conditions.

Therefore, the multiphase clock generating circuit in the first embodiment according to the invention in FIG. 3 can generate multiphase clock signals which have a frequency nearly equal to that of input clock signal and whose phases are shifted approximately by cycle T.

Next, a multiphase clock generating circuit in the second preferred embodiment according to the invention will be explained referring to FIG. 10. Meanwhile, explanations, described below, for the circuit for generating multiphase clock in the second preferred embodiment according to the invention are also applicable to a method for generating multiphase clock in the second preferred embodiment according to the invention.

Figure 10:
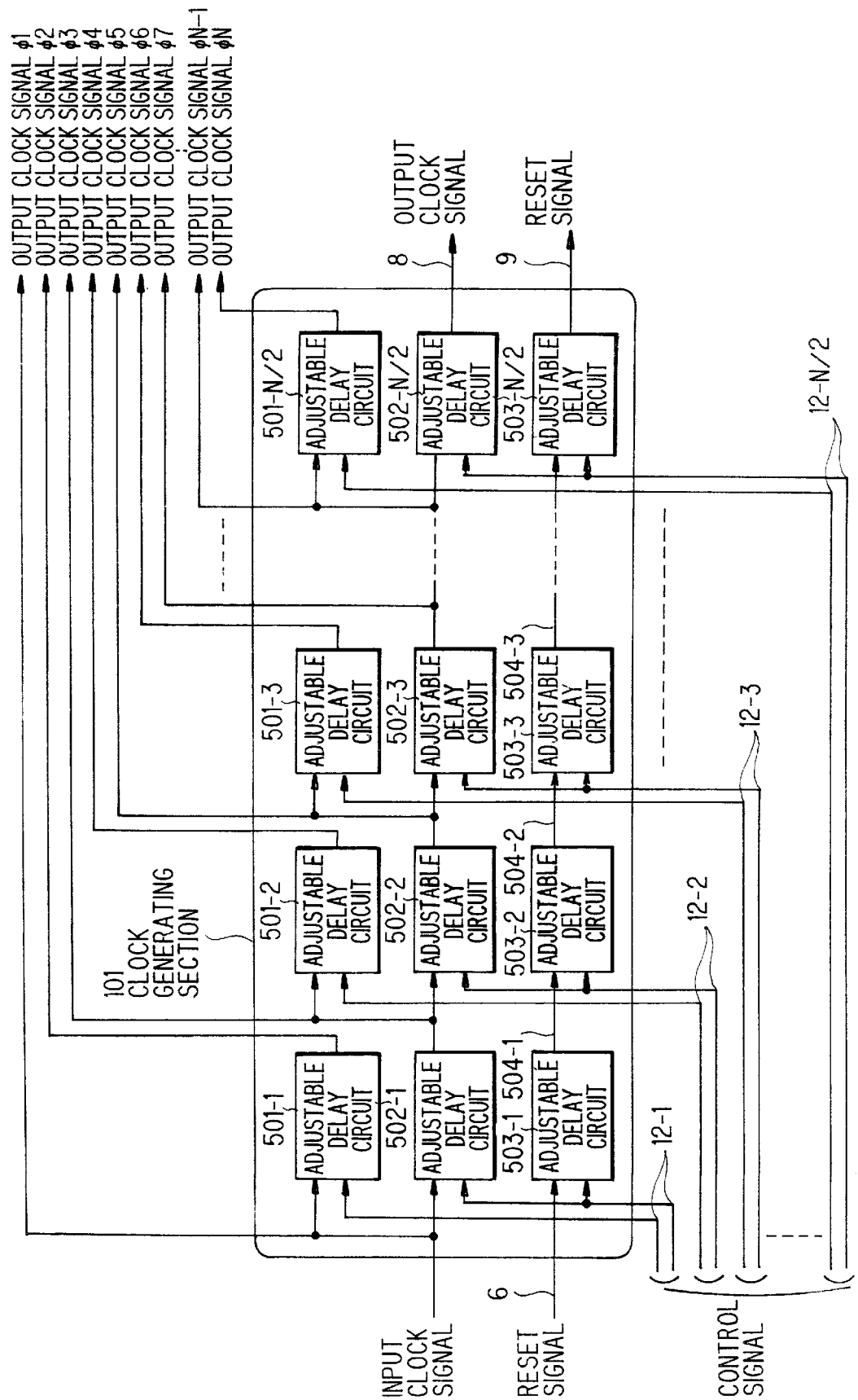
FIG. 10 is a block diagram showing a compositional example of a clock generating section provided for a multiphase clock generating circuit in a second preferred embodiment according to the invention.

FIG. 10 is a block diagram showing the composition of a clock generating section 101 provided for the multiphase clock generating circuit in the second embodiment according to the invention. In FIG. 10, like signals are indicated by like reference numerals as used in FIG. 4.

In the second embodiment, except that the clock generating section 101 is composed shown in FIG. 10, the composition and operation are all similar to those in the first embodiment. Namely, the multiphase clock generating circuit in the second embodiment according to the invention is composed by replacing the clock generating section 1 in FIG. 3 with the clock generating section 101 in FIG. 10.

So, for the multiphase clock generating circuit in the second embodiment according to the invention, only the clock generating section 101 in FIG. 10 is explained below.

As shown in FIG. 10, the clock generating section 101 provided for the multiphase clock generating circuit in the second embodiment according to the invention has adjustable delay circuits connected in series the number of which is half of the number N given as the phase number of N-phase clock. Namely, it is half of the number of adjustable delay circuits of the clock generating section 1 in FIG. 4.

Also, the clock generating section 101 in FIG. 10 has a group of adjustable delay circuits 502-1, . . . , 502-N/2 that are fed with input clock signal like a pipeline and then outputs output clock signal 8, a group of adjustable delay circuits 503-1, . . . , 503-N/2 that are fed with reset signal 6 like a pipeline and then outputs reset signal 9, and a further-stage group of adjustable delay circuits 501-1, . . . , 501-N/2 that are composed of N/2 adjustable delay circuits.

The operation of the clock generating section 101 in FIG. 10 is explained below.

First, the N/2 adjustable delay circuits 502-1, . . . , 502-N/2 are fed with clock signal, adding the delay amount that cycle T is equally divided by nearly N/2, outputting N/2 output clock signals.

Namely, while the delay amount in the first embodiment is given by dividing cycle T by nearly N, in the second embodiment shown in FIG. 10, the delay amount that cycle T is divided equally by nearly N/2 is available.

Then, N/2 output clock signals from the adjustable delay circuits 502-1, . . . , 502-N/2 are unalteredly output as the output clock signals, and are simultaneously input to the adjustable delay circuits 501-1 to 501-N/2, which are not included in the feedback circuit, thereby delayed into 1/2 of the delay amount, i.e., the delay amount that cycle T is equally divided by nearly N, at the adjustable delay circuits 502-1, . . . , 502-N/2, obtaining further N/2 output clock signals.

Thus, summing up the N/2 outputs from the adjustable delay circuit 502-1 to 502-N/2 and the N/2 outputs from the adjustable delay circuit 501-1 to 501-N/2, N N-phase clock signals are output.

The operation of the clock generating section 101 in FIG. 10 is explained further in detail. As shown in FIG. 10, the clock generating section 101 is composed of adjustable delay circuits 502-y, where y is an arbitrary integer of 1 or more and N/2 or less, that are fed with input clock signal and then generate output signals which have a frequency nearly equal to that of input clock signal and whose phases are shifted sequentially by 360 degrees/(N/2), adjustable delay circuits 501-x, where x is an arbitrary integer of 1 or more and N/2 or less, that are fed with input clock signal and then generate output signals which have a frequency nearly equal to that of input clock signal and whose phases are shifted sequentially by 360 degrees/N, and adjustable delay circuits 503-y, where y is an arbitrary integer of 1 or more and N/2 or less, that are fed with reset signal and then generate reset signal 9 that a similar delay amount to that of adjustable delay circuit 502-y is added.

Figure 11:
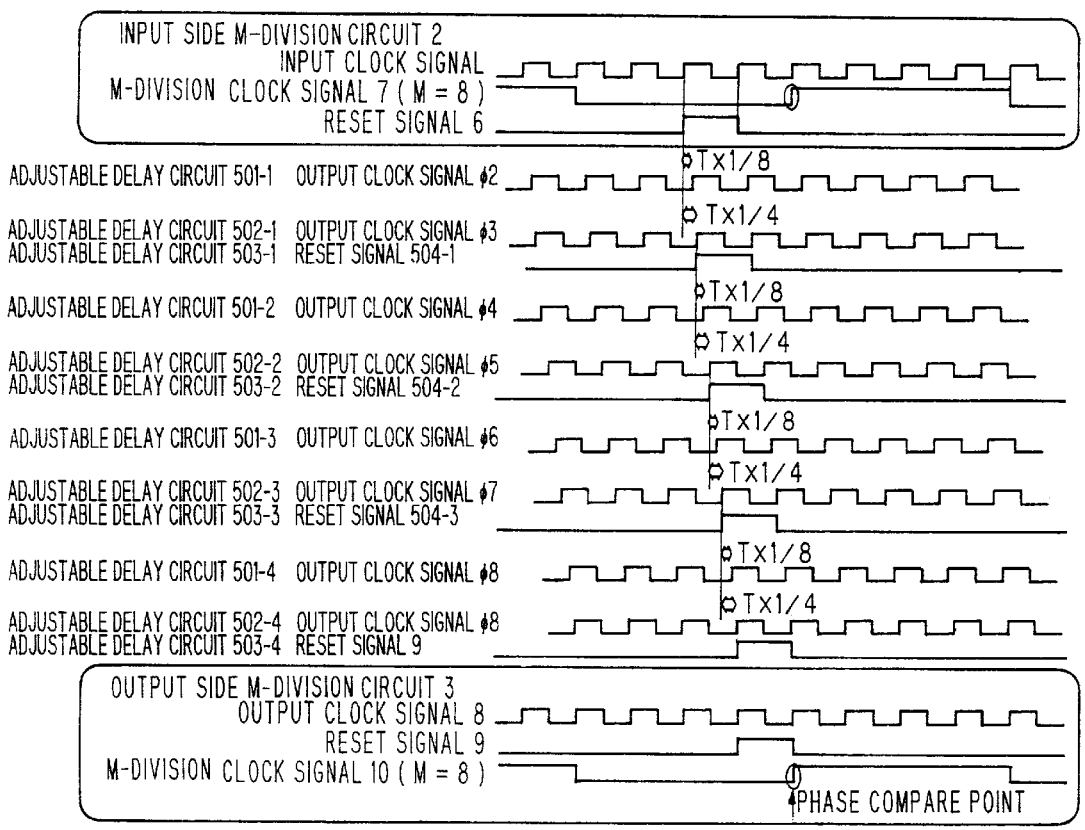
FIG. 11 is a time chart relating to the operation of the clock generating section in FIG. 10.

In examples explained below, the phase number N of N-phase clock signal generated is 8, x is 4 and y is 2. FIG. 11 is a time chart showing the operation of the clock generating section 101 in FIG. 10.

First, the adjustable delay circuit 501-1 is fed with input clock signal, outputting output clock signal φ2 that a delay of Tx(1/8) is added to the cycle T of input clock signal.

Also, the adjustable delay circuit 502-1 is fed with input clock signal, outputting output clock signal φ3 that a delay of Tx(1/4) is added.

Similarly, the adjustable delay circuit 503-1 is fed with reset signal 6, outputting reset signal 504-1 that a similar delay to that of adjustable delay circuit 502-1, i.e., a delay of Tx(1/4), is added.

The control of these adjustable delay circuits 501-1, 502-1 and 503-1 is conducted simultaneously.

Repeating the operation of the adjustable delay circuit 501-1 at the adjustable delay circuits 501-2 to 501-4 to follow, output clock signals φ2, φ4, φ6 and φ8 are output. Repeating the operation of the adjustable delay circuit 502-1 at the adjustable delay circuits 502-2 to 502-4 to follow, output clock signals φ3, φ5, φ7 and φ8 are output. Repeating the operation of the adjustable delay circuit 503-1 at the adjustable delay circuits 503-2 to 503-4 to follow, reset signals 504-1, 504-2 and 504-3 and reset signal 9 are output.

Then, the output-side M(8)-dividing circuit 3 is fed with the output clock signal 8 and reset signal 9, then outputting M(8)-divided clock signal 10.

Thus, with the clock generating section 101 thus composed, the multiphase clock generating circuit in the second embodiment according to the invention can make a performance similar to that in the first embodiment, even for a high-speed operation circuit.

So, the multiphase clock generating circuit provided with the clock generating section 101 shown in FIG. 10 can obtain an effect similar to that in the first embodiment. Also, although the minimum value of delay amount of the clock generating section 101 may exceed cycle T when input clock signal is fast, in such a case, by making the number of adjustable delay circuits connected in series that compose this feedback circuit 1/2, a delay amount allowable for the clock generating section 1 can be made bigger and easily controlled within the cycle T.

Next, a multiphase clock generating circuit in the third preferred embodiment according to the invention will be explained referring to FIG. 12. Meanwhile, explanations, described below, for the circuit for generating multiphase clock in the third preferred embodiment according to the invention are also applicable to a method for generating multiphase clock in the third preferred embodiment according to the invention.

Figure 12:
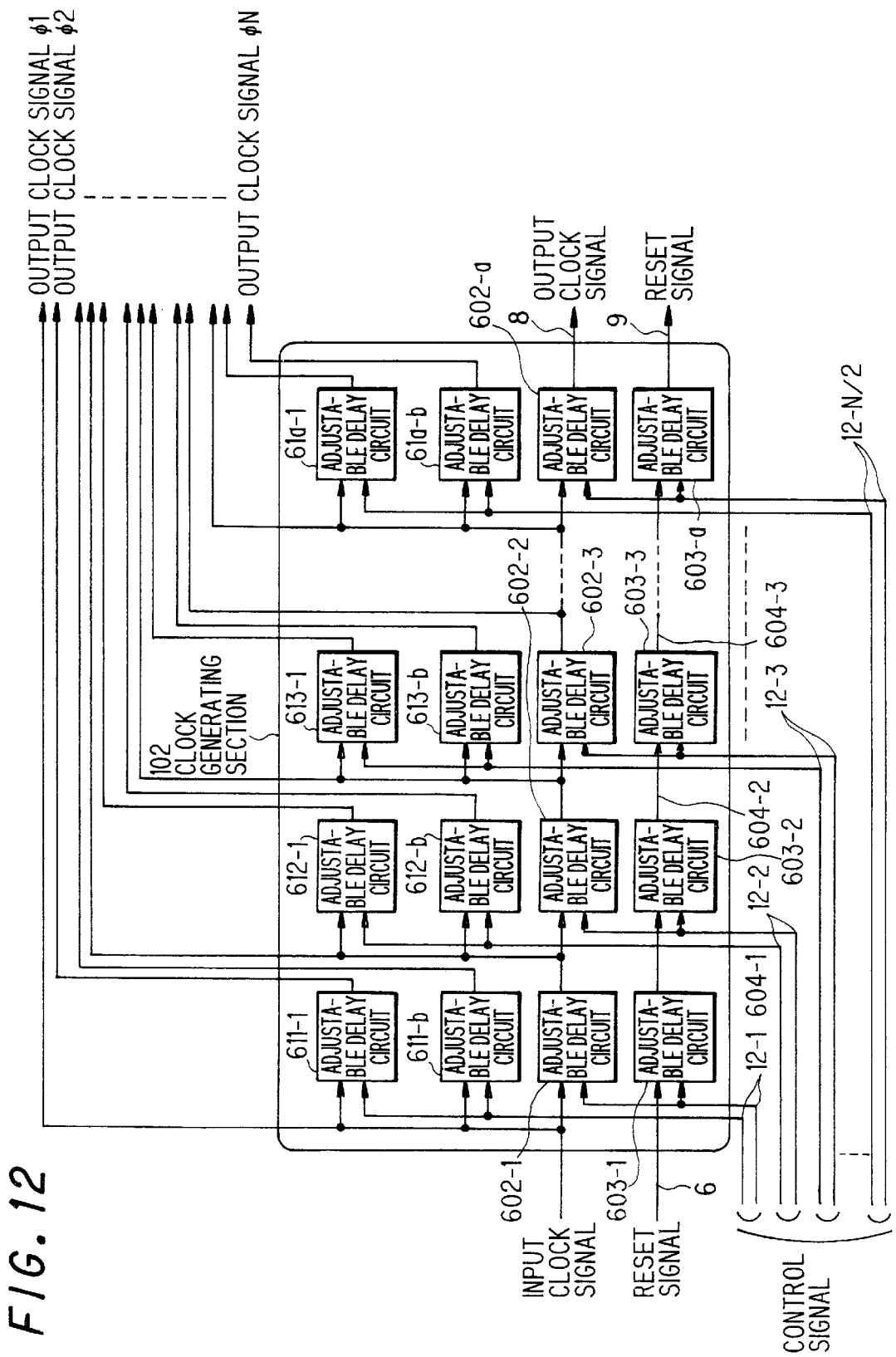
FIG. 12 is a block diagram showing a compositional example of a clock generating section provided for a multiphase clock generating circuit in a third preferred embodiment according to the invention.

FIG. 12 is a block diagram showing the composition of a clock generating section 102 provided for the multiphase clock generating circuit in the third embodiment according to the invention.

In the third embodiment, except that the clock generating section 102 is composed shown in FIG. 12, the composition and operation are all similar to those in the first embodiment. Namely, the multiphase clock generating circuit in the third embodiment according to the invention is composed by replacing the clock generating section 1 in FIG. 3 with the clock generating section 102 in FIG. 12.

So, for the multiphase clock generating circuit in the third embodiment according to the invention, only the clock generating section 102 in FIG. 12 is explained below.

As shown in FIG. 12, the clock generating section 101 provided for the multiphase clock generating circuit in the third embodiment according to the invention has adjustable delay circuits connected in series of number a, where a is an arbitrary integer of 1 or more and N or less, that compose the clock generating section 1 in the first embodiment described earlier, adjustable delay circuits, which are not included in the feedback circuit, of number b, where b is a number to satisfy b=N/a−1, that are connected to the adjustable delay circuits connected in series of number a.

In operation, the adjustable delay circuits 602-1 to 602-a connected in series of number a are added a delay amount that cycle T is equally divided by nearly a, outputting unalteredly as output clock signals of number a.

Also, the output clock signals of number a from the adjustable delay circuits 602-1 to 602-a are input to adjustable delay circuits 611-1 to 611-b, 612-1 to 612-b, 613-1 to 613-b, . . . , 61a-1 to 61b-b that are not included in the feedback circuit, then added a delay amount equal to 1/(b+1) of that of the adjustable delay circuits 602-1 to 602-a, i.e., a delay amount that cycle T is equally divided by nearly N. Output clock signals of number (a+b) are further obtained. Summing up the output clock signals of number a from the adjustable delay circuits 602-1 to 602-a, N N-phase clock signals are output.

Thus, with the clock generating section 102 composed as shown in FIG. 12, the multiphase clock generating circuit in the third embodiment according to the invention can obtain an effect similar to those in the first and second embodiments. Also, by making the number of adjustable delay circuits connected in series 1/2, 1/3, . . . , a clock generating section can be easily applied even for a high-speed clock signal.

Advantages of the Invention:

As seen from the above explanations, in this invention, by composing the multiphase clock generating circuit using a digital circuit, the conventional analogue-digital-mixed PLL circuit can be replaced with such a digital PLL circuit. Therefore, in the multiphase clock generating circuit and method of this invention, the affect by a noise occurred in digital logic and a noise from power supply can be solved easier than the case of using the analogue circuit.

Also, in the multiphase clock generating circuit and method of this invention, by using a frequency-division circuit that conducts the synchronous operation by reset signal to which delay information is added, a multiphase clock that one cycle of clock is equally divided can be generated regardless of the ratio of frequency division.

Further, by making the number of adjustable delay circuits connected in series or steps to generate a multiphase clock 1/2, 1/3, . . . , a clock generating section or process can be easily applied even for a high-speed clock signal.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A multiphase clock generating circuit with a clock generating section for generating N-phase clock signals of number N which have a frequency nearly equal to that of input clock signal and whose phases are sequentially shifted by 360 degrees/N, where N is an arbitrary integer of 2 or more, comprising:

an input side M-division circuit that divides the frequency of said input clock signal by M, where M is an positive integer, outputting it as an input side M-division clock and simultaneously outputting a reset signal to said clock generating section;

an output side M-division circuit that is fed with a delayed reset signal of said reset signal output from said clock generating section is accompanied with a predetermined delay, divides the frequency of an output clock signal output from said clock generating section by M, outputting it as an output side M-division clock; and means for comparing said input side M-division clock output from said input side M-division circuit and said output side M-division clock output from said output side M-division circuit, and controlling a delay amount of said clock generating section based on the comparison result.

2. A multiphase clock generating circuit, comprising:

an input side M-division circuit that is fed with an input clock signal and output an input side M-division clock that the frequency of said input clock signal is divided by M, where M is an positive integer, and synchronized with said input side M-division clock, a reset signal with a cycle nearly equal to that of said input clock signal and a control clock signal;

a clock generating section that is fed with said input clock signal and outputs N-phase clock signals of number N, where N is an arbitrary integer of 2 or more, which have a frequency nearly equal to that of said input clock signal and whose phases are sequentially shifted by 360 degrees/N based on control signals output from a control circuit, an output clock signal which is a delayed version of said input clock signal and a delayed reset signal with a phase nearly equal to that of said output clock signal;

an output side M-division circuit that divides said output clock signal output from said clock generating section by a same frequency-division ratio as said input side M-division clock based on said delayed reset signal, and outputs an output side M-division clock signal;

a phase comparison circuit that is fed with said input side M-division clock output from said input side M-division circuit and said output side M-division clock signal output from said output side M-division circuit, comparing the phases of said input side M-division clock and output side M-division clock signal outputting the comparison result as phase comparison information; and said control circuit that is fed with said control clock signal and said phase comparison information and outputs the control signals used to control the delay amount of said clock generating section.

3. A multiphase clock generating circuit, according to claim 2, wherein:

said output side M-division clock output from said output side M-division circuit based on said delayed reset signal is divided at the time earlier by one clock of said input clock signal than said input side M-division clock.

4. A multiphase clock generating circuit, according to claim 2, wherein:

said clock generating section is composed of a first group of N-division adjustable delay circuits (201-1, 201-2, . . . , 201-N) that N-division adjustable delay circuits of number N, each of which gives a delay that one cycle of said input clock signal is divided by N and has its delay amount controlled based on said control signal, are connected in series, and a second group of N-division adjustable delay circuits that said N-division adjustable delay circuits of number N, each of which has its delay amount controlled based on said control signal, are connected in series;

said input clock signal is input sequentially to each of said N-division adjustable delay circuits composing said first group of N-division adjustable delay circuits like a pipeline;

said reset signal is input sequentially to each of said N-division adjustable delay circuits composing said second group of N-division adjustable delay circuits like a pipeline;

provided that said N-division adjustable delay circuits compose said first group of N-division adjustable delay circuits and said second group of N-division adjustable delay circuits are sequentially defined as a first N-division adjustable delay circuit, a second N-division adjustable delay circuit, . . . , an N-th N-division adjustable delay circuit and k is a positive integer of 1 or more and N or less, said N-phase clock signals of number N are output by that said input clock signal is output as a k-th N-phase clock signal of said N-phase clock signals of number N before being input to a k-th N-division adjustable delay circuit composing said first group of N-division adjustable delay circuits;

an input clock signal output from an N-th N-division adjustable delay circuit (201-N) of said N-division adjustable delay circuits composing said first group of N-division adjustable delay circuits is output as said output clock signal that said input clock signal is delayed; and a reset signal output from an N-th N-division adjustable delay circuit of said N-division adjustable delay circuits composing said second group of N-division adjustable delay circuits is output as said delayed reset signal.

5. A multiphase clock generating circuit, according to claim 2, wherein:

said clock generating section is composed of a first group of a-division adjustable delay circuits, where a is an arbitrary positive integer of 1 or more and N or less, that a-division adjustable delay circuits of number a, each of which gives a delay that one cycle of said input clock signal is divided by a and has its delay amount controlled based on said control signal, are connected in series, a second group of a-division adjustable delay circuits that said a-division adjustable delay circuits of number a, each of which has its delay amount controlled based on said control signal, are connected in series, and a stages of b-division adjustable delay circuits, where b is a positive integer to satisfy b=N/a−1, each stage of which comprises an s-th T/{a(b+1)}·s-division adjustable delay circuit which gives a delay amount s times a delay amount of T/{a(b+1)}, where said delay amount of T/{a(b+1)} is given dividing a value of T/a that one cycle T of said input clock signal is divided by a by (b+1) and s is a positive integer of 1 or more and (N/a−1) or less, and comprise (N/a−1) division adjustable delay circuits obtained varying said s;

provided that said a stages of b-division adjustable delay circuits are sequentially defined as a first stage of b-division adjustable delay circuits, a second stage of b-division adjustable delay circuits . . . , an a-th stage of b-division adjustable delay circuits and t is a positive integer of 1 or more and a or less, said N-phase clock signals of number N are output by that said input clock signal is output unalteredly as a {N/a·(t−1)+1}-th output clock signal of said N-phase clock signals of number N just before being input to a t-th a-division adjustable delay circuit composing said first group of a-division adjustable delay circuits, and simultaneously by that said input clock signal just before being input to said t-th a-division adjustable delay circuit is input to each of the t-th stage of b-division adjustable delay circuits and then is output as from {N/a·(t−1)+1+1}-th output clock signal to {N/a·(t−1)+(N/a−1)}-th output clock signal of said N-phase clock signals of number N.

6. A multiphase clock generating circuit, according to claim 4, wherein:

said N-division adjustable delay circuit is composed of m fixed delay elements from a first fixed delay element to a m-th fixed delay element, where m is an arbitrary integer of 1 or more, that are fed with an input signal and then output adding a predetermined fixed delay to said input signal and a selector that is fed with said control signal and then outputs selecting a signal to be output from said m fixed delay elements; and a signal output from an r-th fixed delay element is input to said selector and is simultaneously input to the (r+1)-th fixed delay element as the input signal of said (r+1)-th fixed delay element, where r is a positive integer of 1 or more and up to (m−1).

7. A multiphase clock generating circuit, according to claim 5, wherein:

at least one of said a-division adjustable delay circuit and said s-th T/{a(b+1)}·s-division adjustable delay circuit which gives a delay amount s times a delay amount of T/{a(b+1)} is composed of m fixed delay elements from a first fixed delay element to a m-th fixed delay element, where m is an arbitrary integer of 1 or more, that are fed with an input signal and then output adding a predetermined fixed delay to said input signal and a selector that is fed with said control signal and then outputs selecting a signal to be output from said m fixed delay elements; and a signal output from an r-th fixed delay element is input to said selector and is simultaneously input to the (r+1)-th fixed delay element as the input signal of said (r+1)-th fixed delay element, where r is a positive integer of 1 or more and up to (m−1).

8. A multiphase clock generating circuit, according to claim 2, wherein:

said control circuit is composed of a counter that is fed with said phase comparison information and said control clock signal, counting said phase comparison information based on the timing of said control clock signal, outputting its counted value, and decoders that are fed with a signal output from said counter, decoding said signal, outputting it as a control signal.

9. A multiphase clock generating method for generating N-phase clock signals of number N which have a frequency nearly equal to that of input clock signal and whose phases are sequentially shifted by 360 degrees/N at a clock generating step, where N is an arbitrary integer of 2 or more, comprising:

an input side M-division step that divides the frequency of said input clock signal by M, where M is an positive integer, outputting it as an input side M-division clock and simultaneously outputting a reset signal to said clock generating step;

an output side M-division step that is fed with a delayed reset signal that said reset signal output from said clock generating step is accompanied with a predetermined delay, divides the frequency of an output clock signal output from said clock generating step by M, outputting it as an output side M-division clock signal; and a step for comparing said input side M-division clock output from said input side M-division step and said output side M-division clock output from said output side M-division step, and controlling a delay amount at said clock generating step based on the comparison result.

10. A multiphase clock generating method, comprising:

an input side M-division step that is fed with an input clock signal and outputs an input side M-division clock that the frequency of said input clock signal is divided by M, where M is an positive integer, and synchronized with said input side M-division clock, a reset signal with a cycle nearly equal to that of said input clock signal and a control clock signal;

a clock generating step that is fed with said input clock signal and outputs N-phase clock signals of number N, where N is an arbitrary integer of 2 or more, which have a frequency nearly equal to that of said input clock signal and whose phases are sequentially shifted by 360 degrees/N based on control signals output from a control step, an output clock signal that said input clock signal is delayed and a delayed reset signal with a phase nearly equal to that of said output clock signal;

an output side M-division step that divides said output clock signal output from said clock generating step by a same frequency-division ratio as said input side M-division clock based on said delayed reset signal, and outputs an output side M-division clock signal;

a phase comparison step that is fed with said input side M-division clock output from said input side M-division step and said output side M-division clock output from said output side M-division step, comparing the phases of said input side M-division clock and output side M-division clock signal, outputting the comparison result as phase comparison information; and said control step that is fed with said control clock signal and said phase comparison information and outputs the control signals used to control the delay amount of said clock generating step to said clock generating step.

11. A multiphase clock generating method, according to claim 10, wherein:

said output side M-division clock output from said output side M-division step based on said delayed reset signal is divided at the time earlier by one clock of said input clock signal than said input side M-division clock.

12. A multiphase clock generating method, according to claim 10, wherein:

said clock generating step comprises of a first group of N-division adjustable delay steps to conduct N-division adjustable delay steps of number N, each of which gives a delay that one cycle of said input clock signal is divided by N and has its delay amount controlled based on said control signal, and a second group of N-division adjustable delay steps to conduct said N-division adjustable delay steps of number N, each of which has its delay amount controlled based on said control signal;

said input clock signal is input sequentially to each of said N-division adjustable delay steps composing said first group of N-division adjustable delay steps like a pipeline;

said reset signal is input sequentially to each of said N-division adjustable delay steps composing said second group of N-division adjustable delay steps like a pipeline;

provided that said N-division adjustable delay steps to compose said first group of N-division adjustable delay steps and said second group of N-division adjustable delay steps are sequentially defined as a first N-division adjustable delay step, a second N-division adjustable delay step, . . . , an N-th N-division adjustable delay step and k is a positive integer of 1 or more and N or less, said N-phase clock signals of number N are output by that said input clock signal is output as a k-th N-phase clock signal of said N-phase clock signals of number N before being input to a k-th N-division adjustable delay step composing said first group of N-division adjustable delay steps;

an input clock signal output from an N-th N-division adjustable delay step of said N-division adjustable delay steps composing said first group of N-division adjustable delay steps is output as said output clock signal that said input clock signal is delayed; and a reset signal output from an N-th N-division adjustable delay step of said N-division adjustable delay steps composing said second group of N-division adjustable delay steps is output as said delayed reset signal.

13. A multiphase clock generating method, according to claim 10, wherein:

said clock generating step comprises of a first group of a-division adjustable delay steps, where a is an arbitrary positive integer of 1 or more and N or less, to conduct a-division adjustable delay steps of number a, each of which gives a delay that one cycle of said input clock signal is divided by a and has its delay amount controlled based on said control signal, a second group of a-division adjustable delay steps to conduct said a-division adjustable delay steps of number a, each of which has its delay amount controlled based on said control signal, and a stages of b-division adjustable delay steps, where b is a positive integer to satisfy b=N/a−1, each stage of which comprises an s-th T/{a(b+1)}·s-division adjustable delay step which gives a delay amount s times a delay amount of T/{a(b+1)}, where said delay amount of T/{a(b+1)} is given dividing a value of T/a that one cycle T of said input clock signal is divided by a by (b+1) and s is a positive integer of 1 or more and (N/a−1) or less, and comprise (N/a−1) division adjustable delay steps obtained varying said s;

provided that said a stages of b-division adjustable delay steps are sequentially defined as a first stage of b-division adjustable delay steps, a second stage of b-division adjustable delay steps, . . . , an a-th stage of b-division adjustable delay steps and t is a positive integer of 1 or more and a or less, said N-phase clock signals number N are output by that said input clock signal is output unalteredly as a {N/a·(t−1)+1}-th output clock signal of said N-phase clock signals of number N just before being input to a t-th a-division adjustable delay step composing said first group of a-division adjustable delay steps, and simultaneously by that said input clock signal just before being input to said t-th a-division adjustable delay step is input to each of the t-th stage of b-division adjustable delay steps and then is output as from {N/a·(t−1)+1+1}-th output clock signal to {N/a·(t−1)+(N/a−1)}-th output clock signal of said N-phase clock signals of number N.

14. A multiphase clock generating method, according to claim 12, wherein:

said N-division adjustable delay step comprises of m fixed delay steps from a first fixed delay step to a m-th fixed delay step, where m is an arbitrary integer of 1 or more, that are fed with an input signal and then output adding a predetermined fixed delay to said input signal and a selecting step that is fed with said control signal and then outputs selecting a signal to be output from said m fixed delay steps; and a signal output from an r-th fixed delay step is input to said selecting step and is simultaneously input to the (r+1)-th fixed delay step as the input signal of said (r+1)-th fixed delay step, where r is a positive integer of 1 or more and up to (m−1).

15. A multiphase clock generating method, according to claim 13, wherein:

at least one of said a-division adjustable delay step and said s-th T/{a(b+1)}·-s-division adjustable delay step which gives a delay amount s times a delay amount of T/{a(b+1)}comprises m fixed delay steps from a first fixed delay step to a m-th fixed delay step, where m is an arbitrary integer of 1 or more, that are fed with an input signal and then output adding a predetermined fixed delay to said input signal and a selecting step that is fed with said control signal and then outputs selecting a signal to be output from said m fixed delay steps; and a signal output from the r-th fixed delay step is input to said selecting step and is simultaneously input to the (r+1)-th fixed delay step as the input signal of said (r+1)-th fixed delay step, where r is a positive integer of 1 or more and up to (m−1).

16. A multiphase clock generating method, according to claim 10, wherein:

said control step comprises a counting step that is fed with said phase comparison information and said control clock signal, counting said phase comparison information based on the timing of said control clock signal, outputting its counted value, and a decoding step that is fed with a signal output from said counting step, decoding said signal, outputting it as a control signal.

* * * * *